United States Patent [19]

Cooper et al.

[11] Patent Number: 5,375,040
[45] Date of Patent: Dec. 20, 1994

[54] MODULAR ELECTRONIC CIRCUIT HOUSING AND WIRING BOARD

[75] Inventors: David Cooper, Seattle; Kaz Furmanczyk, Marysville, both of Wash.

[73] Assignee: Eldec Corporation, Lynnwood, Wash.

[21] Appl. No.: 954,537

[22] Filed: Sep. 29, 1992

[51] Int. Cl.⁵ ............................................. H05K 5/00
[52] U.S. Cl. ..................... 361/730; 361/748; 361/752; 361/796; 361/818; 174/35 R; 439/108
[58] Field of Search ............ 361/395, 391, 392, 394, 361/397, 399, 424, 728, 729, 730, 736, 737, 748, 752, 796, 816, 818; 174/51, 35 R; 257/723; 439/108, 109, 607, 609

[56] References Cited

U.S. PATENT DOCUMENTS

| | | | |
|---|---|---|---|
| D. 297,928 | 10/1988 | Harpley et al. | D13/4 |
| 4,945,633 | 8/1990 | Hakanen et al. | 29/825 |
| 5,206,796 | 4/1993 | Thompson et al. | 361/424 |

OTHER PUBLICATIONS

Keltec Florida, Inc., "Keltec Military Superiority, DC-DC Power Converters," publication date unknown.

VicorCorporation, "Vicor Express Component Power Solutions," publication date unknown.

*Primary Examiner*—Leo P. Picard
*Assistant Examiner*—Young Whang
*Attorney, Agent, or Firm*—Christensen, O'Connor, Johnson & Kindness

[57] ABSTRACT

A generally rectangular housing base or body portion has an upward-opening central cavity and mounting ears extending from each corner. A wiring board on which electronic circuit components are mounted is supported in the cavity of the base. Each end portion of the wiring board extends from the cavity between two of the mounting ears. The top of the cavity is closed by a lid to enclose the circuit components. The opposite ends of the wiring board projecting from the housing cavity are adapted for connection of different pin or stud terminal connectors so that the housing-board unit is capable of being easily joined to or arranged with other electrical parts or units.

13 Claims, 5 Drawing Sheets

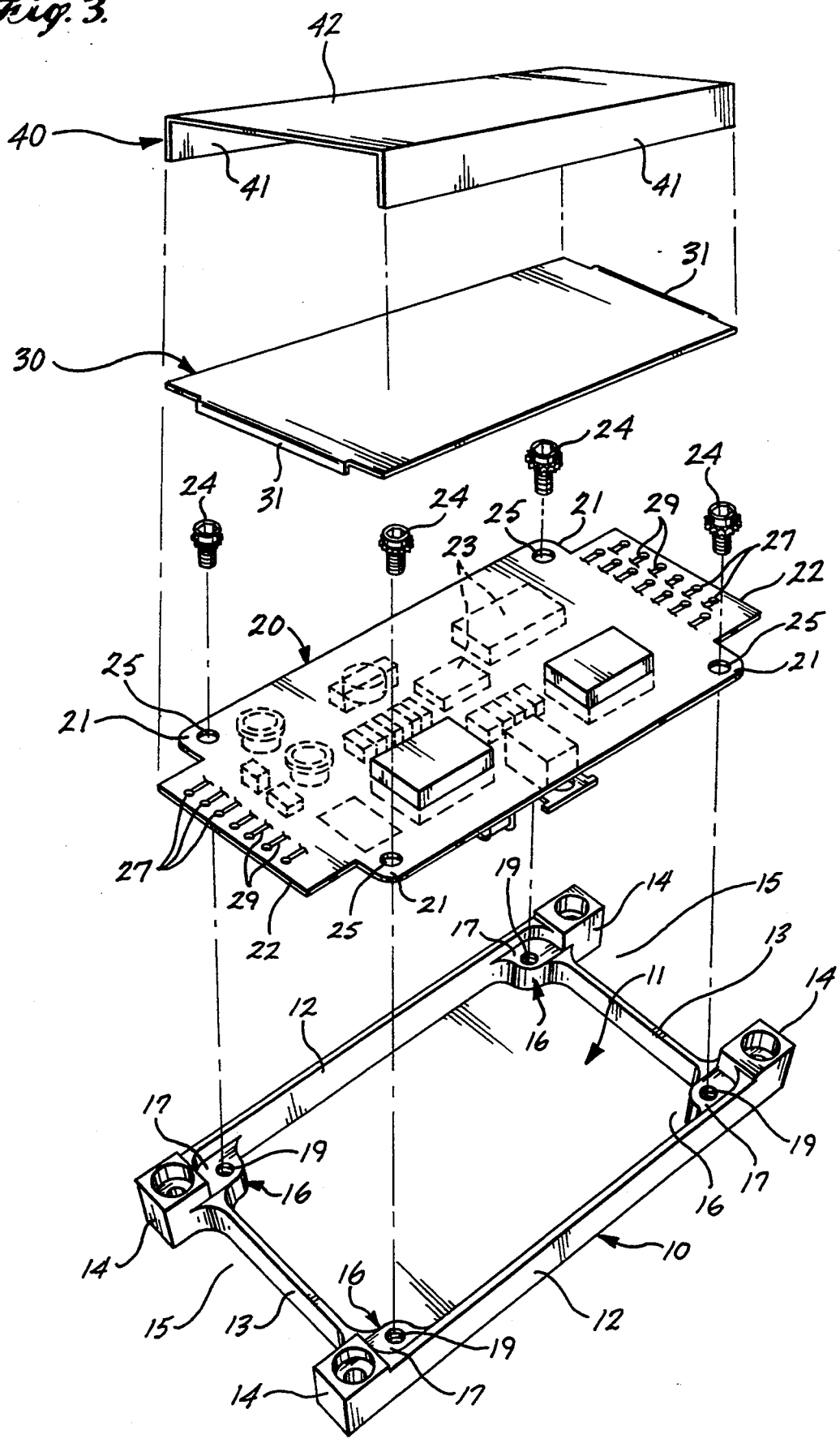

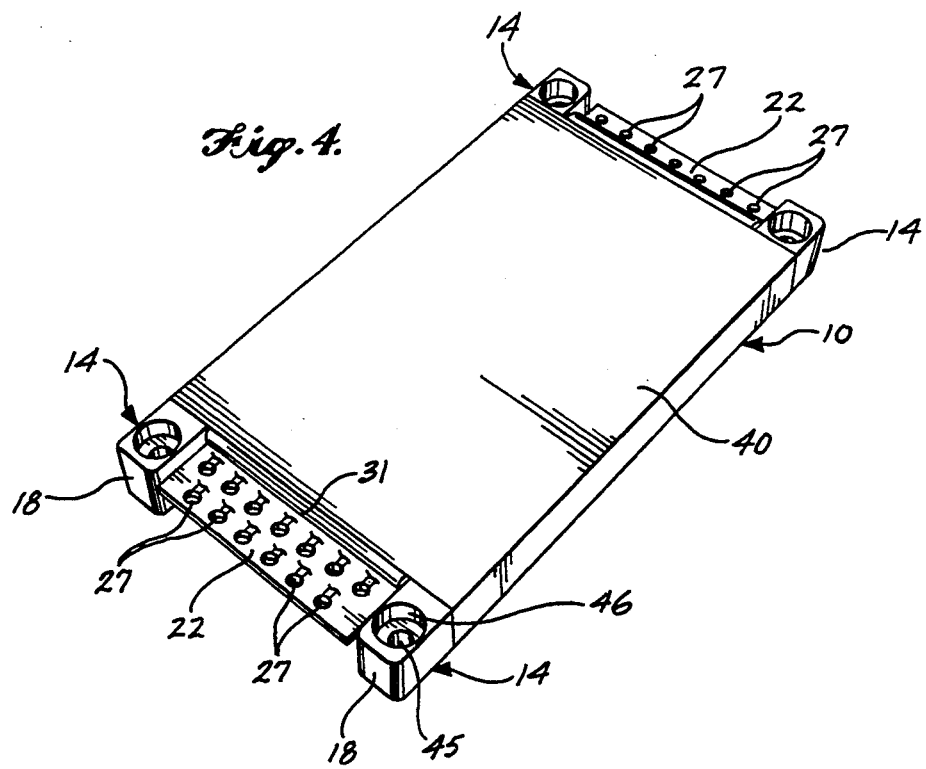
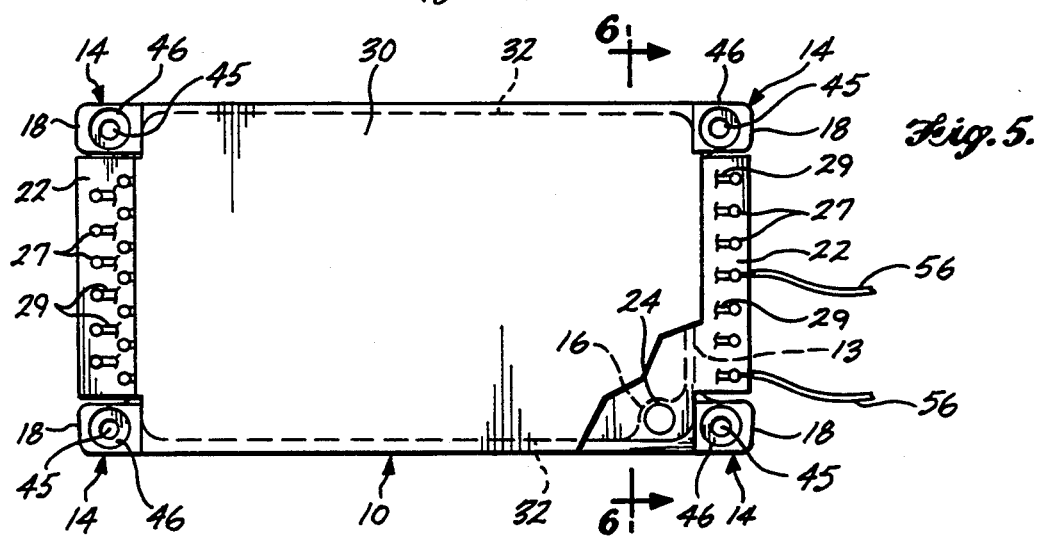
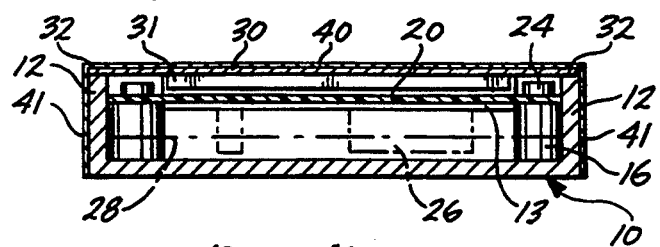

MODULAR ELECTRONIC CIRCUIT HOUSING AND WIRING BOARD

FIELD OF THE INVENTION

The present invention relates to the general field of housings for electrical devices. More specifically, the present invention relates to a housing and wiring board constructed on the basis of a standard pattern and standard dimensions, and adapted for different terminal configurations, so as to be capable of being easily joined to or arranged with other electrical parts or units.

BACKGROUND OF THE INVENTION

Components of electronic circuits often are arranged on thin, flat wiring boards which then may be mounted in a preformed casing or housing. Terminal connectors such as pins or studs project from the housing at predetermined locations and in predetermined directions. One side of the housing may be formed by a heat conductive base plate which itself may be connected to another heat transfer member such as a tinned heat sink. In such a construction the terminal pins or studs typically project oppositely from the base plate.

In known constructions, the configuration of the terminal connectors is determined by the housing used. For any particular composite housing and wiring board unit there are a limited number of ways to interconnect the terminals with other electrical components. The result is that even standard circuits usable in a variety of different types of electrical devices, such as power converters, require a variety different housings and wiring boards, or a custom board and housing unit may be required for a desired arrangement or interconnection with another electrical component.

SUMMARY OF THE INVENTION

The present invention provides a modular electronic circuit housing and wiring board adapted for different terminal configurations so that the composite board and housing can be easily joined to or arranged with other electrical parts or units. In the preferred embodiment, the housing includes a generally rectangular base or body portion having an upward-opening central cavity and mounting ears extending from each corner. The wiring board on which the electronic circuit components are mounted is supported in the cavity of the base. Each end portion of the wiring board extends from the cavity between two of the mounting ears. After installation of the wiring board, the top of the cavity is closed by a lid to enclose the circuit components.

The opposite ends of the wiring board projecting from the housing cavity between its mounting ears are adapted for connection of different pin or stud terminal connectors. The pins or studs can project up or down. Different length studs can be used to adapt the board for different types of connections to other electrical components. For example, long studs can extend above the top or below the bottom of the housing to fit in sockets of other wiring boards or through holes in heat sinks or cold plates. Short pins or studs can be used which do not extend above the top or below the bottom of the housing for a somewhat sheltered connection of wires to the studs. Right angle studs can be used which project endwise from the housing. In each instance, the studs are accessible for inspection or cleaning or for easy access by test equipment without disconnecting the studs from other components.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 3 is a top perspective of a modular electronic circuit housing and wiring board in accordance with the present invention with parts shown in exploded relationship, including a base or body portion, a wiring board, a lid and a top adhesive strip or label.

FIG. 4 is a top perspective corresponding to FIG. 3 but with the parts assembled.

FIG. 5 is a top plan of the assembled modular electronic circuit housing and wiring board in accordance with the present invention with the outer adhesive strip or label removed and parts broken away.

FIG. 6 is a transverse vertical section along line 6—6 of FIG. 5 but with the outer adhesive strip or label applied.

FIG. 7 is a side elevation of the modular electronic circuit housing and wiring board in accordance with the present invention with the top adhesive strip or label removed and with parts broken away.

DETAILED DESCRIPTION OF THE PREFERRED EMBODIMENT

Figure 1:
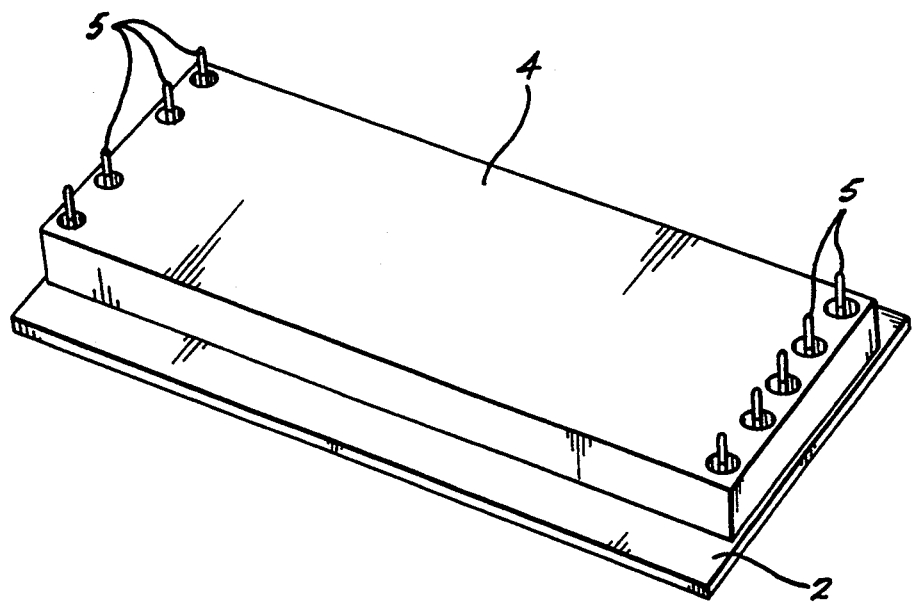
FIG. 1 is a top perspective of a conventional electronic circuit housing and wiring board.
Figure 2:
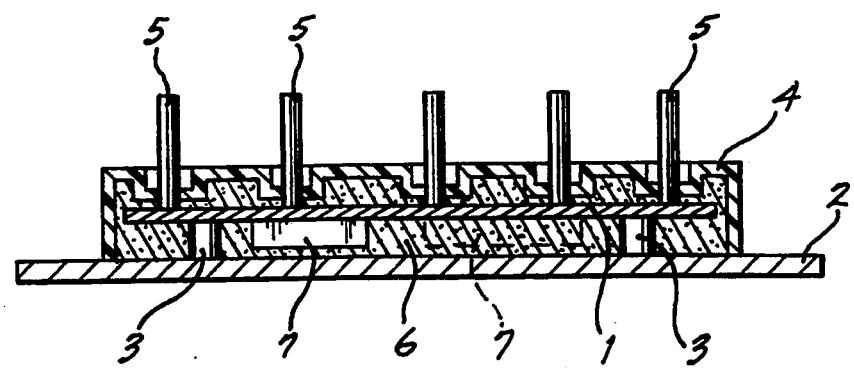
FIG. 2 is a transverse vertical section through the conventional housing and wiring board of FIG. 1.

With reference to FIG. 1 and FIG. 2, conventionally the components of an electronic circuit, such as a power converter circuit, can be mounted on a thin, flat printed wiring board 1. Board 1 can be supported above a heat conductive base plate 2 by upright posts 3. The sides and top of the board can be substantially enclosed in a preformed rigid housing 4. Terminal connectors in the form of upright pins or studs 5 extend upward from the board 1 at predetermined locations so as to pass through holes formed in the top of the housing 4. The electronic circuit and board 1 can be encapsulated in potting compound 6, such as a suitable heat conductive but electrically insulative epoxy. Heat from heat-generating electrical components 7 of the electronic circuit is conducted through the potting compound 6 to the base plate 2. The base plate 2 can be mounted on a tinned heat sink, for example.

In the conventional construction illustrated in FIGS. 1 and 2, the terminal pins or studs 5 project oppositely from the heat conductive base plate 2. There are a limited number of options for arranging the housed electronic circuit adjacent to another electrical component or unit, and there are a limited number of options for connecting the terminal studs to another electrical component or unit. A separate printed wiring board with sockets positioned to register with the upward-projecting terminal studs can be fitted downward over the studs, or wires can be soldered to the studs. If for any particular application the arrangement of studs and base plate is inappropriate, a different housing construction is required, even if the electronic circuit otherwise is capable of performing the desired function. Also, additional space is required beyond the body of the unit to accommodate the terminal studs or to enable attachment of wires.

In contrast, the modular electronic circuit housing and wiring board in accordance with the present invention is adapted for use with different terminal pins or studs and in different mounting configurations so as to be usable in a wider variety of applications without the need to alter the standard pattern and dimensions of the housing. With reference to FIG. 3, the preferred embodiment of a housing in accordance with the present invention includes a generally rectangular base or body portion 10 having a central cavity 11 bordered by longitudinally extending sidewalls 12 and transversely extending end walls 13. The base includes mounting ears 14 extending lengthwise from each corner, beyond the end walls 13, to define an outward-opening notch or recess 15 at each end of the base.

Integral posts 16 project inward into the cavity 11 at each of its four corners. The top surfaces 17 of the posts are spaced a short distance above the top edges of the end walls 13 but substantially below the top edges of the sidewalls 12. The top edges of the sidewalls are, in turn, spaced slightly below the top surfaces of the mounting ears 14.

The wiring board 20 used in the present invention is a thin, flat board of a width slightly less than the distance between the housing sidewalls 12. The rectangular main body of the board is of a length approximately equal to the distance between the end walls 13 such that the corner portions 21 of the board will rest on the upper surfaces 17 of the posts 16. The board has a terminal end portion or tab 22 at each end of a width slightly less than the distance between the mounting ears at the corresponding end of the base 10. As seen in FIGS. 4 and 5, each tab 22 projects from the base cavity over an end wall 13 to a location approximately aligned with the outer ends 18 of the ears 14 so that the top and bottom surfaces of each tab are exposed at the exterior of the housing.

With reference to FIG. 3, board 20 carries the circuit components 23 and is mountable in the housing by screws 24 that extend through holes 25 in the corner portions 21 of the board into threaded blind bores 19 in the posts 16. As best seen in FIG. 6, since the upper surfaces of the posts are above the top edges of the base end walls 13, the board 20 is supported with its end tabs spaced a short distance above the end wall top edges. The board is mounted at a height substantially closer to the top of the housing than to the bottom.

Returning to FIG. 3, the top of the housing is closed by a lid 30 of a width approximately equal to the width of the housing base 10 and of a length approximately equal to the distance between the mounting ears 14 at opposite ends of the housing. The opposite end portions of the lid are notched to fit between the mounting ears and are bent perpendicularly downward toward the wiring board. As best seen in FIG. 6, the side margins 32 of the lid 30 rest on the top edges of the side walls 12. The downturned end portions 31 are sufficiently short that the bottom edge of each end portion of the lid is spaced above the top surface of the wiring board 20. The wiring board, including its terminal end portions, is centered in the aligned horizontal slots formed between the bottom edges of the lid ends 31 and the top edges of the housing end walls 13. As seen in FIG. 5, lengthwise sliding movement of the lid 30 relative to the base 10 is prevented by engagement of the corner portions of the lid against the mounting ears 14, and sideways movement of the lid is prevented by engagement of the downturned end portions of the lid against the facing inner sides of the mounting ears.

Lid 30 is secured in position by a top strip or label 40 having side flanges 41 bent downward from the flat top section 42. The inside surface of the strip or label 40 carries a pressure-sensitive adhesive so that the strip or label adheres to the top of the lid and to the outside upright surfaces of the sidewalls 12.

As seen in FIG. 6, the electronic circuit carried by the board 20 can include large heat-generating components 26 which preferably are positioned so as to project downward from the board toward the bottom of the base cavity. The bottom portion of the cavity can be filled with an appropriate heat conductive but electrically insulative potting compound, the top surface of which is indicated by broken line 28, for conducting heat from the components 26 through the potting compound to the base unit 10 which preferably is heat conductive metal material such as aluminum.

With reference to FIG. 7, preferably each mounting ear 14 has a central through bore 45. A larger counter bore 46 is formed at both the top and bottom of the mounting ear. The composite housing and wiring board can be secured to another baseboard or plate 47 by a screw or bolt 48 having an enlarged head or nut engaged against the shoulder formed by the top or bottom counter bore. Plate 47 can extend either along the top or bottom of the housing. In the orientation illustrated in FIG. 7, plate 47 extends along the bottom of the housing and the fastener is a pan head screw 48 having its shank received in a threaded bore of the plate.

The end tabs 22 of the wiring board 20 have one or more rows of holes 27 connected to appropriate conductors 29 leading to the circuit components 23. As illustrated in FIG. 5, wires 56 can be connected directly to the conductors, such as by soldering, and can be bundled in a harness of a standard plug or socket connector for connection to the terminals of another electronic circuit or unit. In addition, preferably holes 27 are adapted to receive standard terminal connectors, preferably pins or studs of the type illustrated in FIGS. 8-14. The different terminal studs received in the holes 27 can extend up or down and be of different lengths so as to adapt the circuit housing and wiring board in accordance with the present invention for different mounting and connection configurations.

For example, in the configuration shown in FIG. 8 pins 50 extend perpendicularly downward from the exposed end tabs 22 of board 20 to a location below the bottom surface of the housing base 10. Another wiring board 60 having connector sockets or holes registered with pins 50 is mounted against the bottom of the housing base for quick and secure connection of the housing and wiring board in accordance with the present invention to another electronic circuit or unit. Board 60 can be secured to the housing by fasteners of the type shown in FIG. 7.

Figure 9:
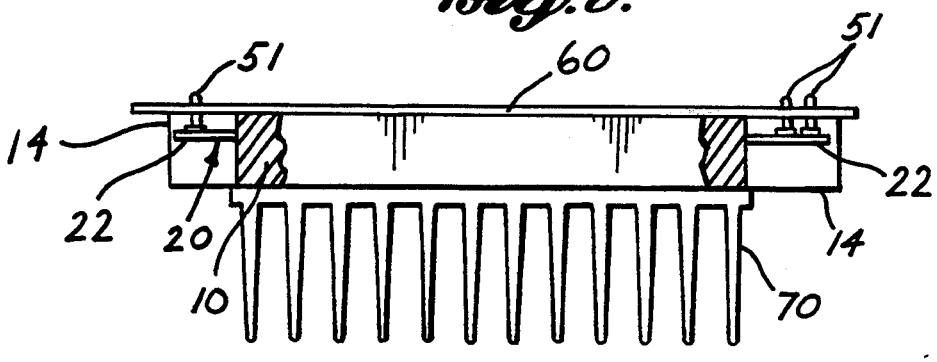

With reference to FIG. 9, an alternative is to use shorter terminal pins or studs 51 projecting upward from the tabs 22 of board 20. Studs 51 extend above the top surface of the housing base 10. Wiring board 60 with the connector sockets or holes registered with the pins 51 can be inserted downward over the pins to effect the desired electrical connection. The housing then can be mounted with its bottom surface flush against the top of a tinned heat sink 70 for quicker dissipation of heat generated by the components carried on the board 20.

Figure 8:
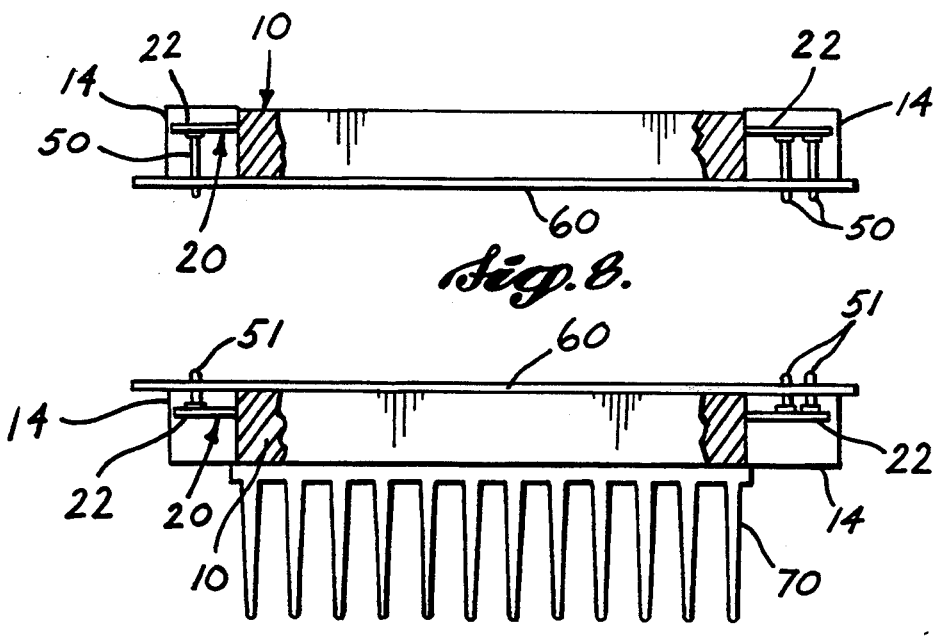
FIG. 8, FIG. 9, FIG. 10, FIG. 11 and FIG. 12 are corresponding diagrammatic side elevations of modular electronic circuit housings and wiring boards in accordance with the present invention illustrating different terminal connectors and different mounting and connection configurations, with parts broken away in each instance.
Figure 10:
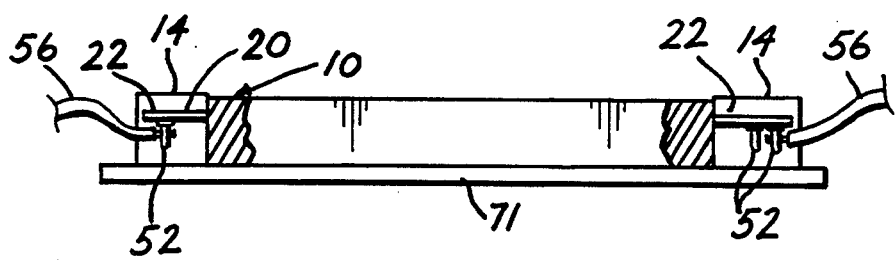
Figure 11:
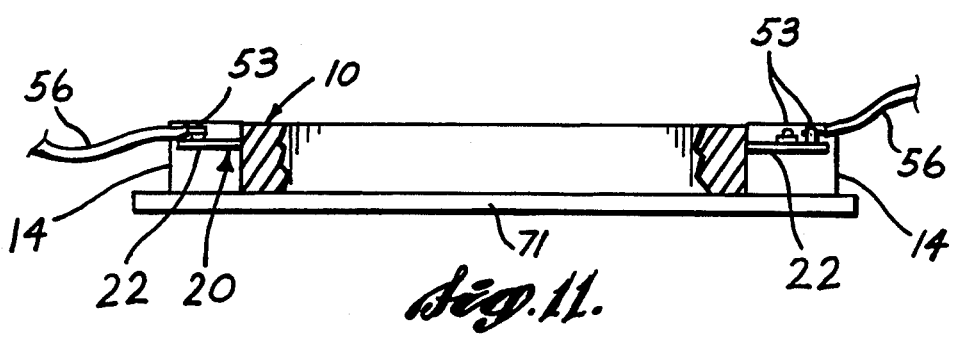

In the configuration illustrated in FIG. 10, terminal pins or studs 52 extend downward from the board, similar to the configuration shown in FIG. 8, but the studs 52 shown in FIG. 10 are shorter than the studs 50 shown in FIG. 8. Studs 52 do not extend to the bottom of the housing base 10. Connection of the terminal studs to the other electronic circuits or units can be by wires 56; and the housing base 10 can be mounted on a heat conductive cold plate 71 without fear of the pins engaging against the plate. Similarly, in the configuration shown in FIG. 11, the base 10 is mounted on a heat conductive cold plate 71 but the terminal pins or studs 53 extend a short distance upward without projecting beyond the upper surface of the electronic circuit housing for connection to other electronic circuits or units by wires 56. The connections of the wires to the studs 52 or 53 are sheltered by the mounting ears which extend along the opposite side edges of the terminal tabs of the wiring board.

Figure 12:
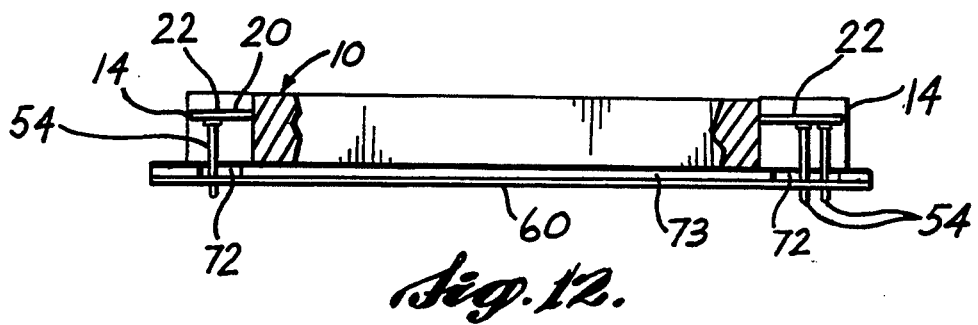

In the configuration shown in FIG. 12, long terminal pins or studs 54 extend downward through holes 72 of a cold plate 73 into registered connector sockets or holes of a wiring board 60.

Figure 13:
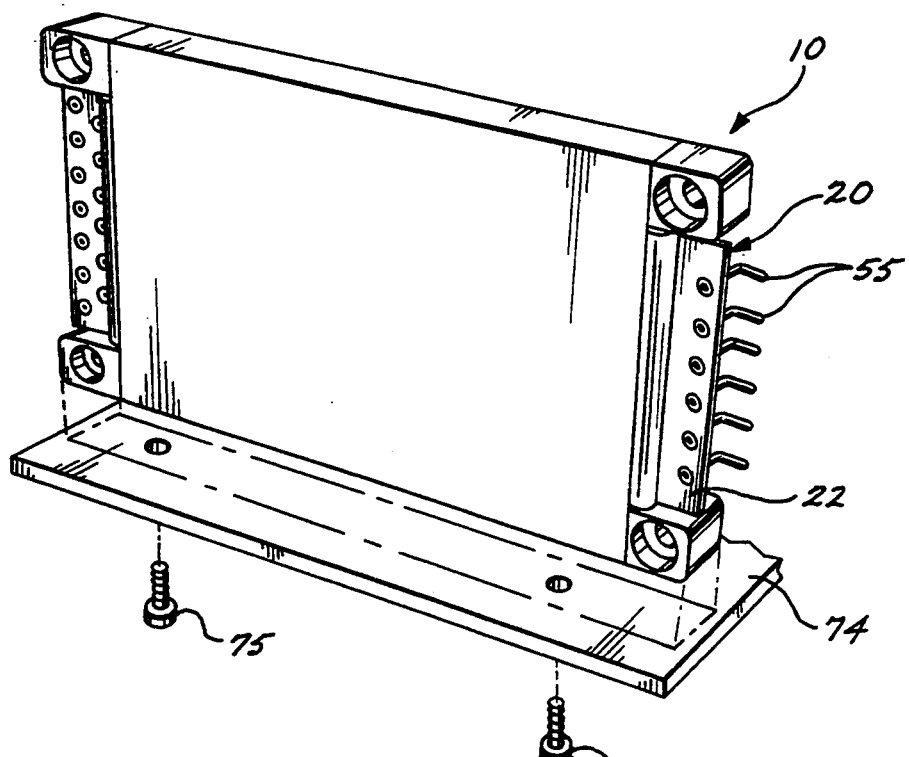
FIG. 13 is a top perspective of a modular electronic circuit housing and wiring board in accordance with the present invention illustrating its use with yet another type of terminal connector and in a different mounting configuration, with some of the parts shown in exploded relationship.
Figure 14:
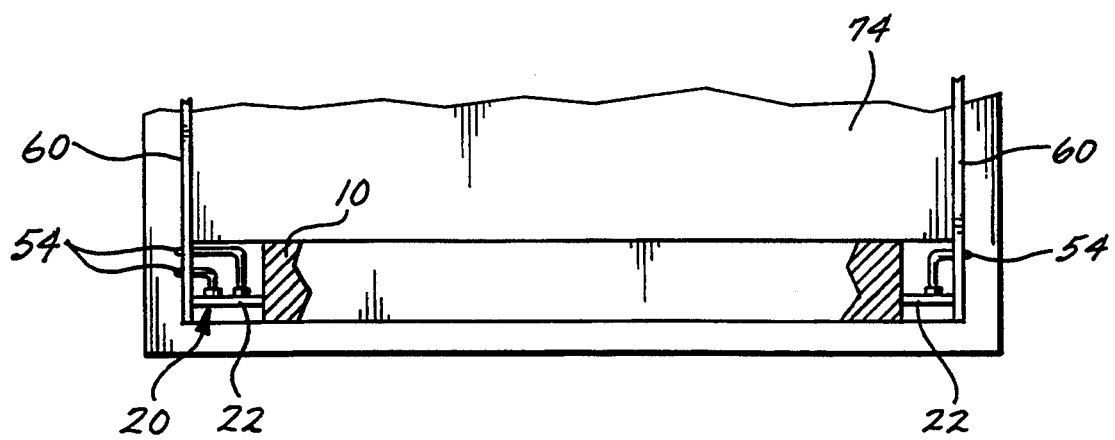
FIG. 14 is a somewhat diagrammatic, fragmentary top plan of the housing and board of FIG. 13 with parts broken away.

FIGS. 13 and 14 illustrate yet another mounting and terminal configuration. The base 10 of the housing can be mounted with one of its sidewalls in engagement with a cold plate or heat sink 74, such as by mounting screws 75. Any of the terminal studs described above can be used in the side mounted configuration. Alternatively, right angle terminal pins or studs 55 can be used which extend from the end tabs 22 of wiring board 20 toward the bottom of the housing base 10 but are bent perpendicularly outward so as to project beyond the opposite ends of the base. As illustrated in FIG. 14, wiring boards 60 having connector sockets or holes registered with the right angle pins 55 can be used to interconnect the pins with other electronic circuits or units.

In each of the mounting configurations shown in FIGS. 8–12 the shales of the terminal studs 50, 51, 52, 53, or 54 are accessible from the open ends of the housing base such as for cleaning or inspection or for connection of appropriate test equipment, either before or after connection to the other electronic circuits or units. In the configuration illustrated in FIG. 13 and FIG. 14, the pins 55 are accessible from the bottom of the base unit, even after interconnection with the wiring boards 60.

By use of the present invention, a single standard sized housing module and wiring board module can be used for different electronic circuits, such as different power converters, and can be configured with different terminal connectors to allow a variety of different arrangements with other components.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. An electronic circuit construction comprising a housing having an exterior, a central cavity and at least one slot communicating between said cavity and said exterior of said housing, and a thin flat wiring board having its major portion received in said cavity and a terminal tab projecting from such major portion of said board through said slot, said terminal tab having top and bottom surfaces exposed at the exterior of said housing, said terminal tab having opposite side edges, and said housing including ear portions extending along said opposite side edges of said terminal tab for sheltering said terminal tab.

2. The construction defined in claim 1, in which the housing includes two slots opening, respectively, through different sides of the housing, the wiring board including two terminal tabs extending, respectively, through said two slots and having top and bottom surfaces exposed at the exterior of the housing.

3. The construction defined in claim 2, in which the two slots open through opposite sides of the housing.

4. The construction defined in claim 2, in which each of the terminal tabs has opposite side edges, the housing including ear portions extending along said opposite side edges of each of the terminal tabs for sheltering the terminal tabs.

5. The construction defined in claim 2, including circuit components carried by the major portion of the wiring board received in the housing cavity, the wiring board including conductor portions on the terminal tabs exposed at the exterior of the housing and extending through the housing slots to the circuit components.

6. The construction defined in claim 5, including terminal connector studs carried on the terminal tabs and in electrical contact with the conductor portions, said terminal connector studs being exposed at the exterior of the housing.

7. The construction defined in claim 6, in which the housing has flat top and bottom horizontal surfaces, and the terminal connector studs project from the terminal tabs to a location beyond one of said horizontal surfaces.

8. The construction defined in claim 6, in which the housing has flat top and bottom horizontal surfaces, and the terminal connector studs project toward one of said surfaces but not beyond such surface.

9. The construction defined in claim 6, in which the terminal connector studs project from the terminal tabs in one direction and are bent at a location spaced from the terminal tabs.

10. The construction defined in claim 1, in which the housing includes a base portion having the cavity and a separate lid mounted on the base portion and substantially closing the cavity, the slot being formed between said base portion and said lid.

11. An electronic circuit construction comprising a housing having an exterior, a central cavity and two slots opening, respectively, through different sides of said housing, said slots communicating between said cavity and said exterior of said housing, a thin flat wiring board having its major portion received in said cavity, and circuit components carried by the major portion of said wiring board received in said housing cavity, said wiring board including two terminal tabs extending, respectively, through said two slots and exposed at the exterior of said housing, said wiring board including conductor portions on said terminal tabs exposed at the exterior of said housing and extending through said housing slots to said circuit components, and including terminal connector studs carried on said terminal tabs and in electrical contact with said conductor portions, said housing having flat top and bottom horizontal surfaces, and said terminal connector studs projecting from said terminal tabs to a location beyond one of said horizontal surfaces.

12. An electronic circuit construction comprising a housing having an exterior, a central cavity and two slots opening, respectively, through different sides of said housing, said slots communicating between said cavity and said exterior of said housing, a thin flat wiring board having its major portion received in said cavity, and circuit components carried by the major portion of said wiring board received in said housing cavity, said wiring board including two terminal tabs extending, respectively, through said two slots and exposed at the exterior of said housing, said wiring board including conductor portions on said terminal tabs exposed at the exterior of said housing and extending through said housing slots to said circuit components, and including terminal connector studs carried on said terminal tabs and in electrical contact with said conductor portions, said housing having flat top and bottom horizontal surfaces, and said terminal connector studs projecting toward one of said surfaces but not beyond such surface.

13. An electronic circuit construction comprising a housing having an exterior, a central cavity and two slots opening, respectively, through different sides of said housing, said slots communicating between said cavity and said exterior of said housing, a thin flat wiring board having its major portion received in said cavity, and circuit components carried by the major portion of said wiring board received in said housing cavity, said wiring board including two terminal tabs extending, respectively, through said two slots and exposed at the exterior of said housing, said wiring board including conductor portions on said terminal tabs exposed at the exterior of said housing and extending through said housing slots to said circuit components, and including terminal connector studs carried on said terminal tabs and in electrical contact with said conductor portions, said housing having flat top and bottom horizontal surfaces, said terminal connector studs projecting from said terminal tabs in one direction and being bent at a location spaced from said terminal tabs.

* * * * *

UNITED STATES PATENT AND TRADEMARK OFFICE
CERTIFICATE OF CORRECTION

PATENT NO. : 5,375,040
DATED : December 20, 1994
INVENTOR(S) : D. Cooper et al.

It is certified that error appears in the above-indentified patent and that said Letters Patent is hereby corrected as shown below:

| COLUMN | LINE | |
|---|---|---|
| 1 | 33 | "variety different" should read --variety of different-- |
| 2 | 67 | "tinned" should read --finned-- |
| 5 | 56 | "shales" should read --shafts-- |

Signed and Sealed this

Twenty-eight Day of March, 1995

Attest:

BRUCE LEHMAN

Attesting Officer

Commissioner of Patents and Trademarks